United States Patent
Patterson

(10) Patent No.: US 7,669,168 B1
(45) Date of Patent: Feb. 23, 2010

(54) METHOD AND APPARATUS FOR DYNAMICALLY CONNECTING MODULES IN A PROGRAMMABLE DEVICE

(75) Inventor: Cameron D. Patterson, Blacksburg, VA (US)

(73) Assignee: Xilinx, Inc., San Jose, CA (US)

( * ) Notice: Subject to any disclaimer, the term of this patent is extended or adjusted under 35 U.S.C. 154(b) by 385 days.

(21) Appl. No.: 11/527,963

(22) Filed: Sep. 27, 2006

Related U.S. Application Data

(62) Division of application No. 10/427,231, filed on Apr. 30, 2003, now Pat. No. 7,124,391.

(51) Int. Cl.
*G06F 17/50* (2006.01)

(52) U.S. Cl. ............... 716/19; 716/2; 716/6; 716/17; 716/18

(58) Field of Classification Search ............... 716/2, 716/6, 17, 18, 19
See application file for complete search history.

(56) References Cited

U.S. PATENT DOCUMENTS

| | | | |
|---|---|---|---|
| 6,260,182 B1 | 7/2001 | Mohan et al. | |
| 6,823,283 B2 | 11/2004 | Steger et al. | |
| 6,920,627 B2 | 7/2005 | Blodget et al. | |
| 7,073,158 B2 * | 7/2006 | McCubbrey | 716/17 |
| 2004/0004496 A1 * | 1/2004 | Madurawe | 326/39 |

OTHER PUBLICATIONS

Xilinx, Inc.; Virtex-II Platform FPGA Handbook; Dec. 6, 2001; available from Xilinx, Inc., 2100 Logic Drive, San Jose, California 95124; pp. 46-53.
Xilinx, Inc.; XAPP151 (v.15); "Virtex Series Configuration Architecture User Guide"; available from Xilinx, Inc., 2100 Logic Drive, San Jose, California 95124; Sep. 27, 2000; pp. 1-45.
Xilinx Inc.; XAPP138 (v2.5); "Virtex FPGA Series Configuration and Readback"; available from Xilinx, Inc., 2100 Logic Drive, San Jose, California, 95124; Nov. 5, 2001; pp. 1-39.
Davin Lim and Mike Peattie; XAPP290 (1.0); "Two Flows for Partial Reconfiguration: Module Based or Small Bit Manipulations"; available from Xilinx, Inc., 2100 Logic Drive, San Jose, California, 95124; May 17, 2002; pp. 1-23.
Xilinx, Inc.; U.S. Appl. No. 10/013,764; Patterson; filed Dec. 10, 2001.

* cited by examiner

*Primary Examiner*—Thuan Do
(74) *Attorney, Agent, or Firm*—W. Eric Webostad

(57) ABSTRACT

Method and apparatus for dynamically connecting modules within a programmable device is described. In an example, a programmable device is programmed with modular circuits. A bitstream is obtained from a database. The bitstream includes a first portion associated with a module and a second portion associated with an interface to the module. The bitstream is then modified with configuration data to connect the interface to one or more of the modular circuits. The programmable device is then configured using the modified bitstream.

6 Claims, 6 Drawing Sheets

METHOD AND APPARATUS FOR DYNAMICALLY CONNECTING MODULES IN A PROGRAMMABLE DEVICE

FIELD OF THE INVENTION

One or more aspects of the invention relate generally to programmable logic devices and, more particularly, to dynamically connecting modules implemented within a programmable logic device.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

In the past, FPGAs accommodated only configuration of the entire array. Accordingly, with each change in a design or the addition of a design, a full configuration bitstream had to be generated for reconfiguring the entire FPGA. Newer FPGA architectures have been developed, however, which accommodate a partial reconfiguration of the array. For example, partial reconfiguration is supported by Virtex® and Virtex-II® series FPGAs, commercially available from Xilinx, Inc. With partial reconfiguration, new configuration data is loaded to configure a specific area of an FPGA, while the rest of the FPGA remains operational and unaffected by the reprogramming.

Partial reconfiguration may be used to dynamically configure an FPGA with specific circuits or "modules". For example, modules may be inserted or removed within an FPGA during operation without affecting other portions of circuitry operating within the FPGA. To enable dynamic module configuration, the input/output interface to a module is designed such that the module can be isolated from other circuitry to which the module is connected when the module is being reconfigured. Heretofore, tri-state buffers were used at the module interface to electrically isolate a module undergoing removal, an initial or subsequent programming of programmable logic, or non-use from one or more other modules. This allowed circuitry within the FPGA to continue to operate, while taking a module undergoing configuration off-line. Routing signals through tri-state buffers, however, adversely affects timing within the FPGA.

Therefore, there exists a need in the art for dynamically connecting modules within a programmable logic device without tri-stating buffers to do so.

SUMMARY OF THE INVENTION

Method and apparatus for dynamically connecting modules within a programmable device is described. In an embodiment, a programmable device is programmed with modular circuits. A bitstream is obtained from a database. The bitstream includes a first portion associated with a module and a second portion associated with an interface to the module. The bitstream is then modified with configuration data to connect the interface to one or more of the modular logic circuits. The programmable device is then configured using the modified bitstream.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for dynamically connecting modules within a programmable logic device is described. One or more aspects of the invention relate to module-based partial reconfiguration of an FPGA. Those skilled in the art, however, will appreciate that the invention may be more generally used to facilitate reconfiguration and connection among modular portions of a programmable logic device.

Figure 1:
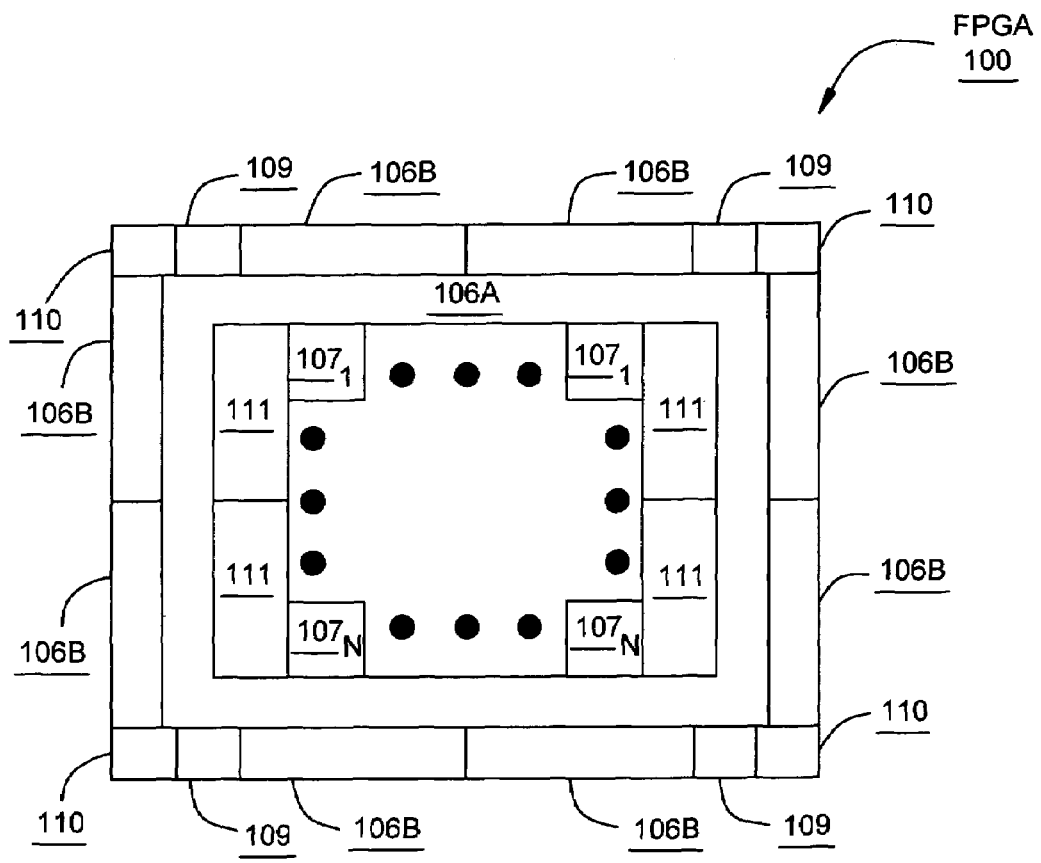
FIG. 1 is a block diagram depicting an exemplary embodiment of a field programmable gate array (FPGA)

FIG. 1 is a block diagram depicting an exemplary embodiment of a field programmable gate array (FPGA) 100. FPGA 100 illustratively includes CLB columns $107_1$ through $107_N$ (collectively referred to as CLBs 107), I/O routing ring 106A, memory 111, such as random access memory, delay lock loop (DLL) blocks 109, multiply/divide/de-skew clock circuits 110, and programmable IOBs 106B. DLL blocks 109 and clock circuits 110 collectively provide well-known digital clock management (DCM) circuits for managing clock signals within FPGA 100. Those skilled in the art understand that FPGA 100 may include other types of logic blocks and circuits in addition to those described herein. For example, there may be programmable Multi-Gigabit Transceivers (MGTs) that are also programmable I/Os and located next to the programmable IOBs 106B. Also, there may be an embedded Application Specific Integrated Circuit (ASIC), such as an embedded processor in FPGA 100 like in the Virtex II Pro™ Platform of Xilinx Corporation of San Jose, Calif.

As is well known in the art, CLBs 107 are programmably connectable to each other, and to I/O routing ring 108, for performing various types of logic functions. Each of CLBs 107 may include one or more "slices" and programmable interconnect circuitry (not shown). Each CLB slice in turn includes various circuits, such as flip-flops, function generators (e.g., a look-up tables (LUTs)), logic gates, memory, and like type well-known circuits. Programmable IOBs 106B are configured to provide input to, and receive output from, one or more of CLBs 107.

As understood by those skilled in the art, a desired circuit may be implemented within FPGA 100 by coupling a configuration bitstream to a configuration port of FPGA 100. The configuration bitstream includes configuration information for CLBs 107, I/O routing ring 106A, and programmable IOBs 106B. Notably, a desired circuit implemented within FPGA 100 may include one or more modular logic circuits or "modules". Incorporating modules into a design allows such modules to be configured, including reconfigured, during operation of FPGA 100. FPGA 100 may be partially reconfigured using a reconfiguration bitstream. Additional detail regarding module-based circuit design as it relates to partial reconfiguration of an FPGA is described in Xilinx Application note "Two Flows for Partial Reconfiguration: Module Based or Small Bit Manipulations", XAPP290 (v1.0), May 17, 2002, which is incorporated by reference herein in its entirety.

Reconfigurable modules are not statically connected to other modules or other fixed portions of a design. Rather, such modules are capable of being isolated from other modules or other fixed portions of the design.

Figure 2:
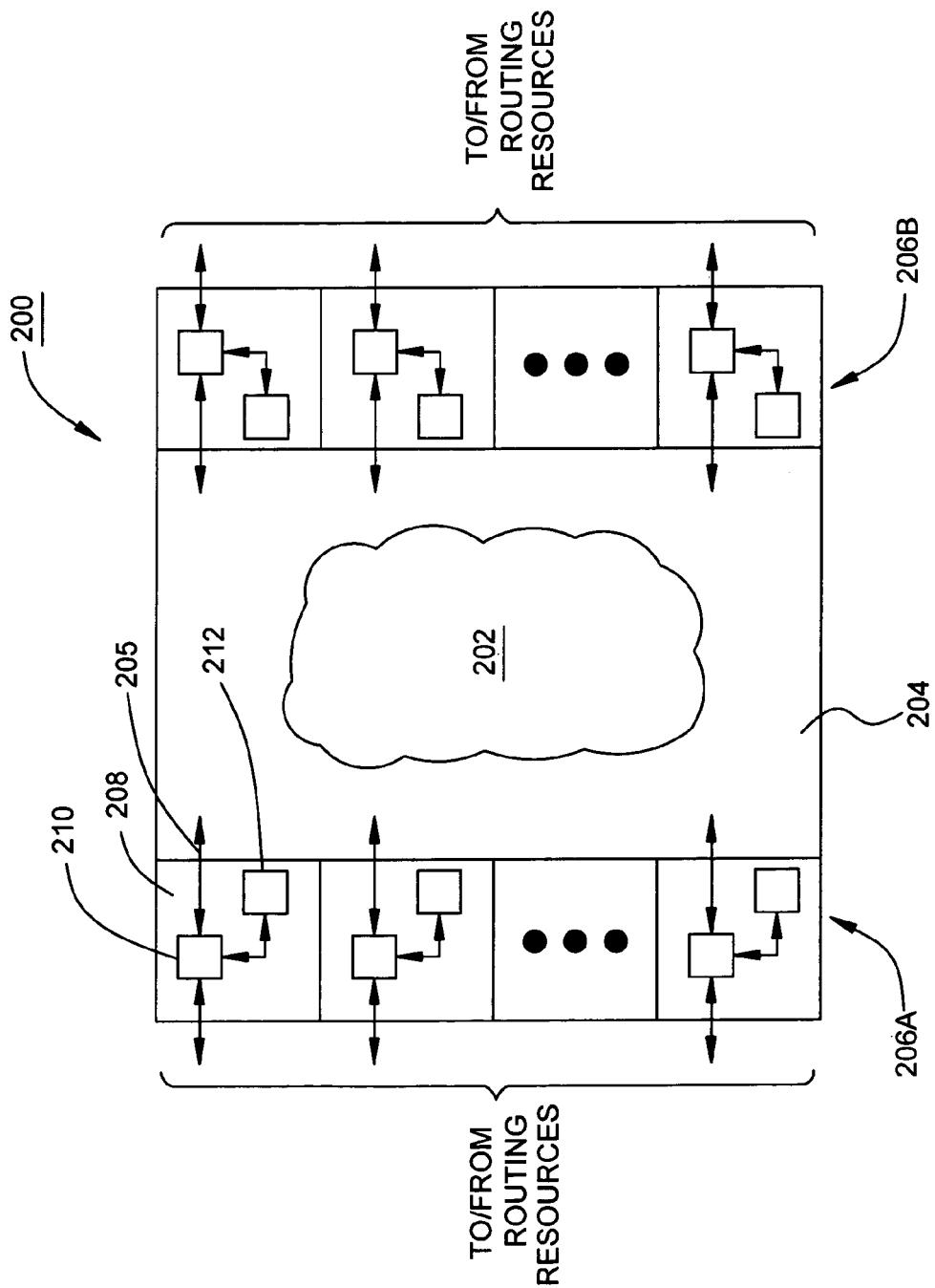
FIG. 2 is a block diagram depicting a module of an exemplary embodiment of the present invention.

FIG. 2 is a block diagram depicting an exemplary embodiment of the present invention of a module 200. Notably, FIG. 2 depicts module 200 in relation to a portion of FPGA 100 in which module 200 is to be configured. Module 200 includes a logic circuit 202, an interface CLB column 206A, and an interface CLB column 206B (collectively referred to as "interface" 206). Logic circuit 202 is configured using programmable logic 204 of FPGA 100. Notably, programmable logic 204 includes a portion of CLBs 107 within FPGA 100. In an embodiment, the number of CLB columns within programmable logic 204 is an integer multiple of a base number of CLB columns. The base number of CLB columns that may be used to implement a module is referred to herein as a "slot". Thus, FPGA 100 includes a plurality of slots and logic circuit 202 may occupy one or more of the slots.

Each of interface CLB column 206A and interface CLB column 206B includes a plurality of CLBs 208. Each of CLBs 208 includes a switch matrix 210, configurable logic 212 coupled to switch matrix 210, and I/O ports 205 from/to Logic circuit 202. Notably, configurable logic 212 includes one or more slices of a CLB, and switch matrix 210 includes switch elements of programmable interconnect circuitry for a CLB.

An illustrative example of CLB 208 is given in a Virtex-II CLB element in the Virtex™-II Platform FPGA Handbook (Copyright 2001), pages 46-53, from Xilinx Corporation of San Jose, Calif. which is herein incorporated by reference. A CLB element has a switch matrix connected to slices (i.e., examples of configurable logic), which may be configured to be a programmable look-up table (LUT), a random access memory (RAM), or a shift register. In the Virtex™-II Platform, CLBs 208 are part of both the interface CLB columns 206A and 206B, as well as the logic circuit 204.

In one embodiment of the present invention one interface CLB 208 is connected to a logic circuit 202 having a second CLB having circuitry similar to or the same as interface CLB 208. In effect there is a pair of CLBs with the second CLB having a functional role such as a programmable look-up table (LUT), a random access memory (RAM), or a shift register, and the interface CLB providing the connection to another pair of interface and functional CLBs. Conceptually, the interface to a module has been separated from the module's function (like the entity and architecture in VHDL), although the CLBs implementing the interface and function may have the same hardware. In an alternative embodiment the second CLB is replaced with a programmable IOB, DLL block, and/or MGT block.

In another embodiment of the present invention one interface CLB 208 is connected to a logic circuit 202 having a plurality of CLBs, where each of the plurality of CLBs has circuitry similar to or the same as interface CLB 208. Hence there is one interface CLB connected to a set of functional CLBs. This set of CLBs are interconnected via their switch matrices to each other to form a functional unit (i.e., logic circuit 202), which may, for example, provide a state machine, a ripple carry adder, a memory, and so forth. The interface CLB 208 connects the functional unit to, for example, a pair of interface and functional CLBs or another interface CLB connected to another functional unit. Other permutations and combinations of interface CLBs and functional CLBs, as apparent to one of ordinary skill in the art from the description hereof, are included in other embodiments of the present invention.

FPGA 100 may be partially reconfigured to implement module 200 using a partial reconfiguration bitstream for module 200. Briefly stated, logic circuitry for a module is programmed using a hardware description language (HDL), synthesized to produce a netlist, mapped, routed, and placed to form the partial reconfiguration bitstream. When module 200 is designed, I/O ports 205 are "statically" coupled to CLBs 208 of interface 206. That is, the connection between I/O ports 205 and CLBs 208 will not change when module 200 is configured within FGPA 100.

Notably, design tools used to design logic circuitry to be programmed in FPGA 100 may dictate that all signals have defined endpoints. In other words, for such design tools, there must be a source and a sink for all signals. However, programmable interconnect structure of FPGA 100 is not a valid signal endpoint. As such, for each of CLBs 208 in interface 206, configurable logic 212 is used to define signal endpoints for I/O ports 205. Within interface 206, actual configuration of configurable logic 212 (e.g., slice settings) is immaterial, since configurable logic 212 is used to serve as a signal endpoint only for design purposes. For example, interface 206 may be a relationally placed macro (RPM) of LUT-based buffers. As described below, after routing, only connectivity to switch matrix 210 is preserved for each of CLBs 208 of interface 206.

For each of CLBs 208, switch matrix 210 is coupled to programmable interconnect circuitry of FPGA 100 (also referred to as "routing resources"), such as I/O routing ring 108. As such, for each of CLBs 208, switch matrix 210 may be configured to couple a respective one of I/O ports 205 of logic circuit 202 to various other programmable logic blocks within FPGA 100. As described below, configuration of switch matrix settings in interface 206 is performed at "run-time", that is, during reconfiguration of FPGA 100.

In this manner, interface 206 is used to wrap logic circuit 202, where interface 206 is capable of being programmed for connecting I/O ports 205 to various other programmable logic blocks of FPGA 100. As such, I/O ports 205 of logic circuit 202 are not designed to be statically connected to other modules or other fixed logic circuits within FGPA 100. Thus, module 200 may be dynamically configured within FPGA 100 and connected to other modules or other fixed logic circuits within FPGA 100 as appropriate during run-time. Although interface 206 has been described as a single interface column of CLBs 206A and 206B on respective sides of logic circuit 202, interface 206 may have more than one interface column of CLBs on a side. Accordingly, one or more interface columns of CLBs 206A may be on one side of logic circuit 202, and one or more interface columns of CLBs 206B may be on another side of logic circuit 202. In an alternative embodiment FIG. 2 may include an interface CLB row (not shown) similar to the interface CLB column on the top or bottom or both of logic circuit 202.

The module wrapper shown in FIG. 2 separates the module's implementation from its interface, and facilitates the following: 1) module input and output ports are made accessible in the wrapper; 2) all modules to be composed have standard interfaces that can be connected by overlaying (rather than abutting) their wrappers. The overlay technique reduces CLB overheads and the distance that inter-module signals must travel; 3) module port connections can be modified without effecting module state; for example, configuration read/modify/write cycles do not preserve the contents of memory elements such as SRL 16s; 4) the wrapper permits modules to be any multiple of a standard width, which reduces the packing and fragmentation complications arising from unrestricted module widths; 45) at compile time, the wrapper uses logic elements (as required by the ISE tools) to define junction points for connections to and from a module, hence, these logic elements may be bypassed when the modules are connected; 6) inter-module signals can be probed in the wrapper; for example, the signals could be captured using a parallel-in-serial-out register; a wrapper-implemented serial-in-parallel-out register allows inputs to be injected into a module; and 7) having all module inputs or outputs available in a single column facilitates the use of long-line resources to implement non-neighbor connections.

Notably, there may be different types of connections between modules in FPGA 100, such as neighbor connections and non-neighbor connections. A neighbor connection occurs when two modules are adjacent to one another such that their interface CLB columns may be shared. A non-neighbor connection occurs when two modules are not adjacent to one another, such that their interface CLB columns may not be shared.

Figure 6:
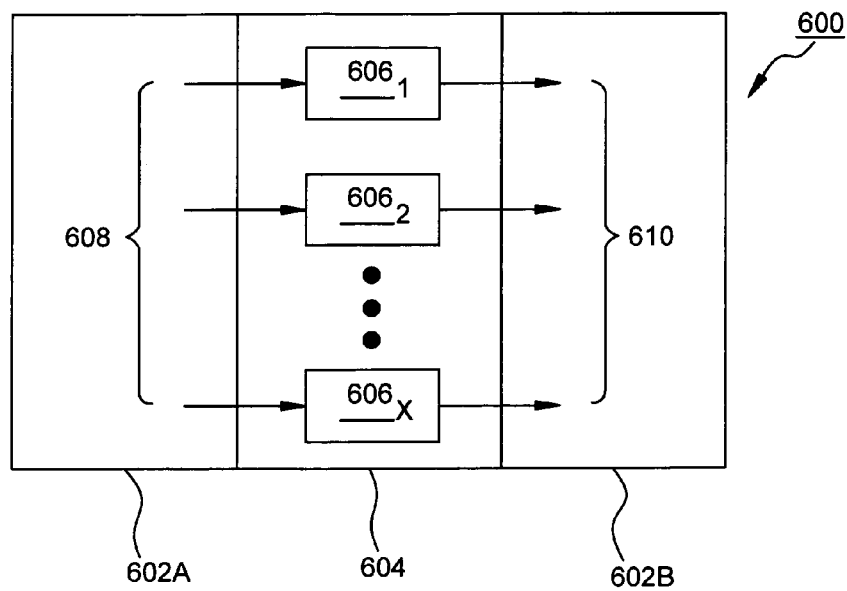
FIG. 6 is a block diagram depicting an exemplary embodiment of the present invention of a portion of an FPGA having neighbor connections between modules.

FIG. 6 is a block diagram depicting an exemplary embodiment of a portion 600 of FPGA 100 having neighbor connections between modules 602A and 602B. Portion 600 includes a module 602A and a module 602B, where a data path allows output of module 602A to be coupled to input of module 602B. When module 602B is dynamically reconfigured, at least a portion of its interface CLB column is common to at least a portion of an interface CLB column of module 602A. As such, module 602A shares an interface CLB column 604 with module 602B.

Thus, output ports 608 of module 602A and input ports of module 602B are coupled to switch matrices $606_1$ through $606_x$ of interface CLB column 604. Since each of switch matrices $606_1$ through $606_x$ has access to an output port of module 602A and an input port of module 602B, switch matrices $606_1$ through $606_x$ may be reconfigured during run-time to connect output ports 608 to input ports 610. In this manner, a data path between module 602A and module 602B may be formed by programming interface CLB column 604.

Notably, there are many more switch matrices in interface CLB column 604 than there are buffers for tri-stating. As such, the number of signal connections between modules using an interface CLB column can greatly exceed the number or signal connections provided by a tri-stated buffer.

In one embodiment of the present invention an algorithm for connecting each wrapper column of adjacent modules is given below. The algorithm is described for the Virtex-II FPGA of Xilinx Corp. using the notation of FIG. 6 for illustration purposes. Note: most of the signals should have a direct connection in the switch matrix, since: 1) at most 8 single-fanout horizontal connections are implemented by the switch matrix. 2) when the register is not required, there are no routing constraints arising from the use of IMUX, OMUX, slice and TBUF resources (from FIG. 2, IMUX is the input multiplexer in switch 210 which sends data to 212 and OMUX is the output multiplexer in switch 210 which receives data from 212); and 3) in Virtex-II, static connections to the modules use flexible double and hex lines, rather than the more highly constrained long lines.

for each switch matrix $606_n$ in wrapper column 604 { for each pair of ports ($608_j$; $610_k$) to be connected in $606_n${
      if the register is not required
      clear the register's IMUX and OMUX connections
      if there is a direct connection between $608_j$ and $610_k$
      update the configuration of $606_n$
      else if $608_j$ and $610_k$ can be connected through a slice s
      update the configuration of $606_n$ and s
      else {
      for other switch matrices $606_m$ in 604, in order by distance from $606_n$ {
      if $608_j$ and $610_k$ can connect via $606_m$
      update the configuration of $606_n$ and $606_m$
      }
      }
   }
}

Figure 7:
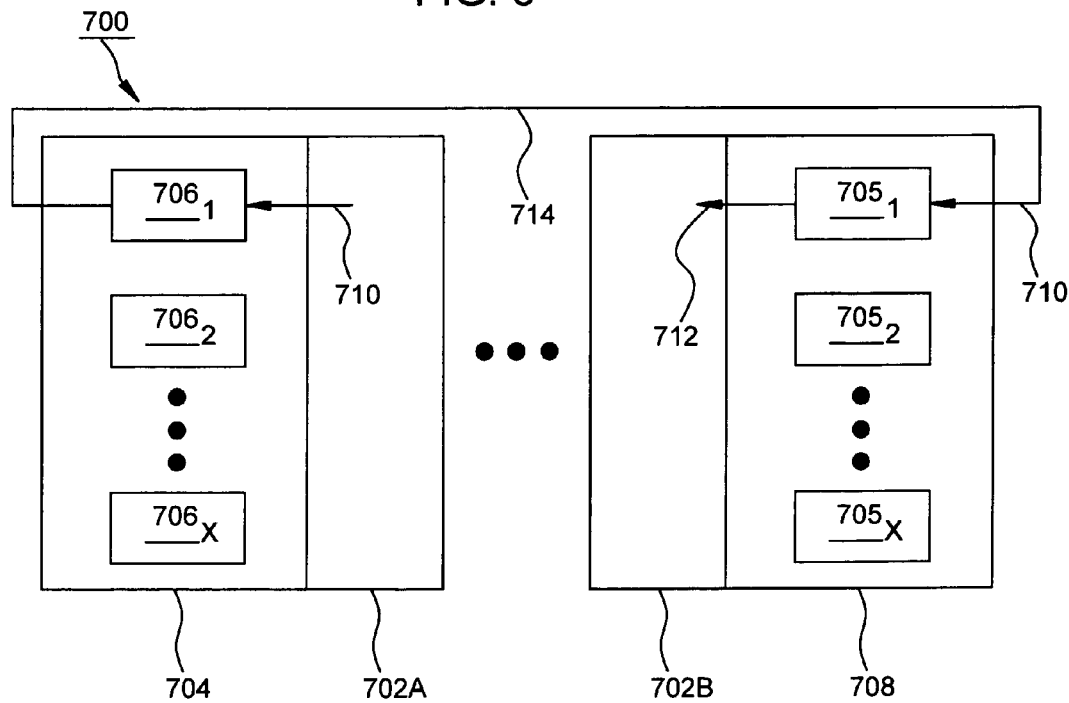
FIG. 7 is a block diagram depicting an exemplary embodiment of the present invention of a portion of an FPGA having non-neighbor connections between modules.

FIG. 7 is a block diagram depicting an exemplary embodiment of a portion 700 of FPGA 100 having non-neighbor connections between modules 702A and 702B. Portion 700 includes a module 702A and a module 702B, where a data path is such that output of module 702A is coupled to input of module 702B. Module 702A includes an interface CLB column 704, and module 702B includes an interface CLB column 708. Interface CLB column 704 includes switch matrices $706_1$ through $706_x$, and interface CLB column 708 include switch matrices $705_1$ through $705_x$.

An output port 710 of module 702A is coupled to switch matrix $706_1$. An input port 712 of module 702B is coupled to switch matrix $705_1$. Both switch matrix $706_1$ and switch matrix $705_1$ may be coupled to one another through the routing resources of FPGA 100. With each of switch matrices $706_1$ and $705_1$ having access to the routing resources of FPGA 100, switch matrices $706_1$ and $705_1$ are reconfigurable during run-time to connect output port 710 to input port 712. In this manner, a data path between module 702A and module 702B may be formed by programming interface CLB column 704 and interface CLB column 708.

For example, a horizontal long-line 714 may be used to connect output port 710 with input port 712. All horizontal long-lines are available for non-neighbor connections, since horizontal long-lines cannot be used for module implementation. For example, there are 24 long-lines per CLB row in a Virtex-II FPGA manufactured by Xilinx, Inc, where a particular long-line may be accessed every 6 CLB columns. In order to provide all modules within FPGA 100 with access to the same set of four long-lines for this example, interface CLB columns 704 and 708, should occupy column positions that are a multiple of six. Thus, up to four non-neighbor connections may be made. For purposes of clarity by example, only a single long-line connection is shown in FIG. 7. Alternatively, if interface CLB column 704 includes W columns of CLBs, rather than a single CLB column, then the number of non-neighbor connections supported by data paths has an upper bound of the minimum of an integer multiple of the number of columns W, which for the above example is 4W or 24.

In one embodiment of the present invention an algorithm for connecting each wrapper column of non-adjacent modules is given below. The algorithm is described for the Virtex-II FPGA of Xilinx Corp. using the notation of FIG. 7 for illustration purposes.

```
for switch matrix pairs (706_{m1}; 705_{m2}) in wrapper columns
    (704; 708) {
  for each pair of ports (710_i; 712_j) to be connected across
      (706_{m1}; 705_{m2}) {
    if the register is not required
      clear the register's IMUX and OMUX connections in
          706_{m1} and 705_{m2}
    if 710_i and 712_j can connect to an available long line across
        (706_{m1}; 705_{m2})
      update the configuration of 706_{m1} and 705_{m2}
    else {
      for other switch matrix pairs (706_{m3}; 705_{m4}) in (704; 708),
          in order by distance from (706_{m1}; 705_{m2}) {
        if there is an available long line I across (706_{m3}; 705_{m4})
        {
          if 710_i and 712_j can connect via I
            update the configuration of 706_{m1}, 705_{m2}, 706_{m3}, and
                705_{m4}
        }
      }
    }
  }
}
```

Various modules may be designed as described above with respect to FIG. 2 and compiled to produce partial reconfiguration bitstreams. The partial reconfiguration bitstreams may then be stored in a library for access by an FPGA during reconfiguration. During reconfiguration, a partial reconfiguration bitstream for a selected module is modified with configuration data necessary to reconfigure an interface of CLB columns of such a selected module. Thus, such a selected module may be connected with a reconfigured data path.

Figure 3:
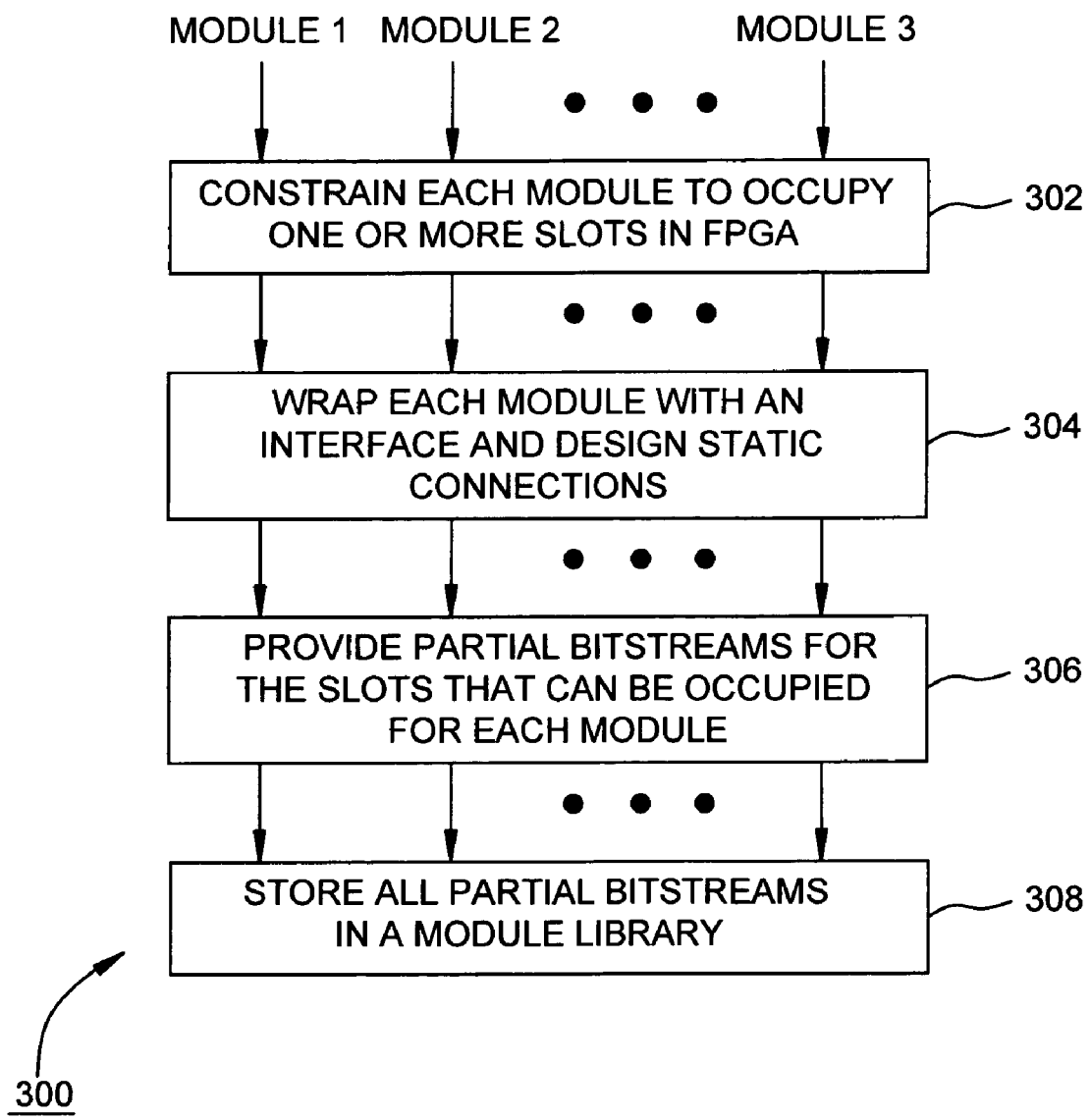
FIG. 3 is a block diagram depicting an exemplary embodiment of the present invention of a process for creating a module library.

FIG. 3 is a block diagram depicting an exemplary embodiment of a process 300 for creating a module library. Process 300 begins at step 302, where each of M module designs provided is constrained to occupy one or more slots within an FPGA. At step 304, each of the constrained module designs is wrapped with an interface of CLB columns, as described above with respect to FIG. 2.

At step 306, partial reconfiguration bitstreams are produced for each of the wrapped module designs, where each of the wrapped module designs occupies one or more slots. For example, if there are M modules having a width of a single slot, and the FPGA has N slots, a total of M*N partial reconfiguration bitstreams are produced at step 306. This is a significant reduction in the number of bitstreams over that of conventional pre-compiling of all possible data paths between the M modules.

At step 308, the partial reconfiguration bitstreams produced in step 306 are stored in a module library.

Figure 4:
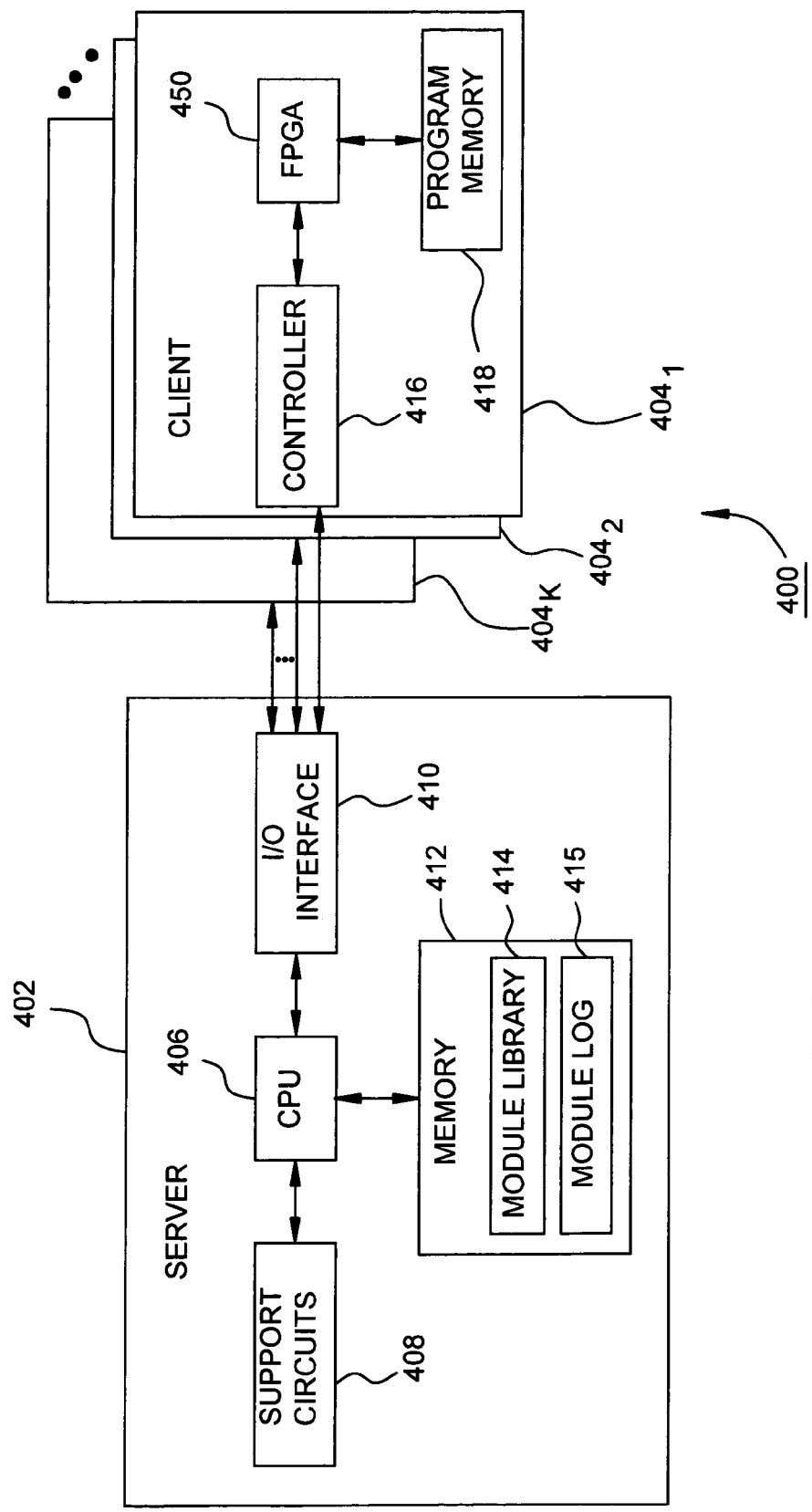
FIG. 4 is a block diagram depicting an exemplary embodiment of the present invention of a configuration bitstream server system.

FIG. 4 is a block diagram depicting an exemplary embodiment of a configuration bitstream server system 400. System 400 includes a server 402 coupled to clients $404_1$ through $404_K$, where K is an integer greater than zero (collectively referred to as clients 404). Server 402 includes a central processing unit (CPU) 406, a memory 412, a variety of support circuits 408, and an input/output (I/O) interface 410. CPU 406 may be any type of microprocessor known in the art. Support circuits 408 for CPU 406 include conventional cache, power supplies, clock circuits, data registers, I/O interfaces, and the like. I/O interface 410 may be directly coupled to memory 412 or coupled through CPU 406, and may be coupled to a conventional keyboard, network, mouse, printer, and interface circuitry adapted to receive and transmit data, such as data files and the like.

Memory 412 may include one or more of the following: random access memory, read only memory, magneto-resistive read/write memory, optical read/write memory, cache memory, magnetic read/write memory, and the like. Memory 412 may store a database or collection of partial reconfiguration bitstreams for implementing modules within an FPGA ("module library 414"). Notably, the partial reconfiguration bitstreams are used to configure an FPGA to implement particular modules and are referred to herein as "module bitstreams". Memory 412 may optionally store a log of requested modules for each of the clients 404 ("module log 415"). As described in more detail below, module log 415 may be used to facilitate connectivity between a requested module and its associated data path within an FPGA of a client requester.

For purposes of clarity, only client $404_1$ is shown in any detail. It is to be understood, however, that clients $404_2$ through $404_N$ include the same or similar components to those shown in client $404_1$. Client $404_1$ includes a controller 416, an FPGA 450, and program memory 418. Program memory 418 may be EEPROM, EPROM, PROM, or the like, though other types of memory may be used. Program memory 418 may be used to store a complete configuration bitstream for initial power-up configuration of FPGA 450.

The initial configuration bit stream or the reconfiguration bit stream configures FPGA 450 through a configuration port, such as a JTAG, SelectMap, or ICAP port. The selection of the port is left up to the user. In one embodiment, for the Virtex II Pro™, which is an FPGA with an embedded processor, the ICAP port may be used. In this embodiment, the server 402 and controller 416 may be entirely contained within the FPGA 450.

Controller 416 includes an interface in communication with I/O interface 410 of server 402 and includes an interface for communication with FPGA 450. Controller 416 may implemented externally to FPGA 450 on a printed circuit board (PCB), for example. Alternatively, controller 416 may be embedded within FPGA 450 (e.g., an embedded microprocessor). Controller 416 facilitates configuration of FPGA 450.

Figure 5:
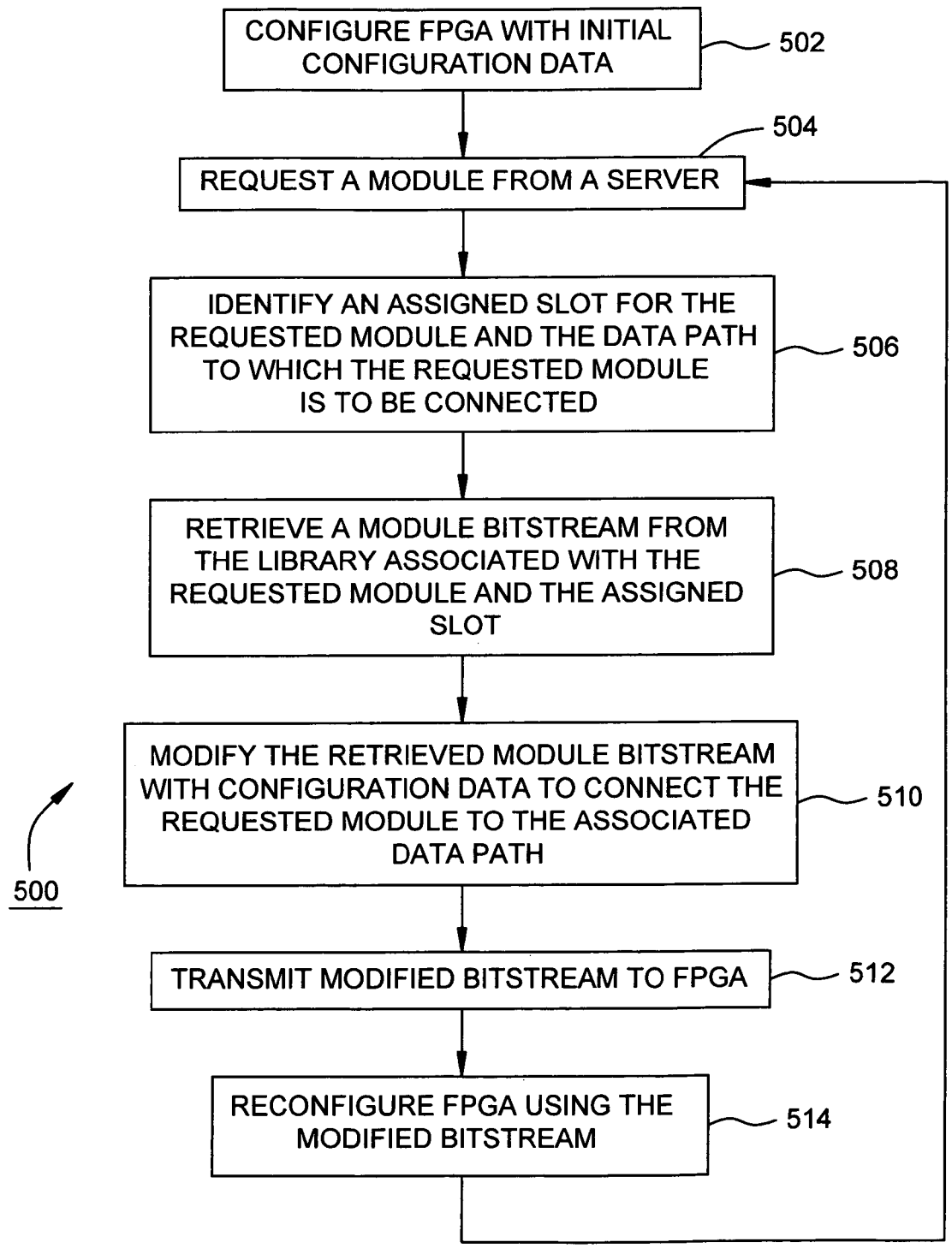
FIG. 5 is a block diagram depicting an exemplary embodiment of the present invention of a process for configuring an FPGA.

Operation of system 400 may be understood with reference to FIG. 5. FIG. 5 is a block diagram depicting an exemplary embodiment of a process 500 for configuring an FPGA. Process 500 begins at step 502, where the FPGA is configured with initial configuration data. At step 504, a module is requested from a server. At step 506, an assigned slot in the FPGA for the requested module is identified. Further at 506, the data path to which the requested module is to be connected is identified. For example, the client FPGA may transmit to the server the assigned slot and data path information as part of the module request in step 504.

At step 508, a module bitstream associated with a requested module and an assigned slot is retrieved from a module library. For example, for each module, module bitstreams are produced for all slots that may be occupied. At step 510, a retrieved module bitstream is modified with configuration data to connect the requested module to an associated data path. Configuration data may include information for programming switch matrices of an interface for the module such that the switch matrices route I/O ports of the module to one or more target modules for a data path design. Both neighbor and non-neighbor connections are supported, as described above with respect to FIGS. 6 and 7. At step 512, the modified bitstream is transmitted to an FPGA. At step 514, the FPGA is reconfigured using the modified bitstream.

In an embodiment, rather than modifying a module bitstream during operation of an FPGA ("on the fly") to connect the module to its associated data path, switch-box settings used to connect all pairs of adjacent modules may be predetermined. Pre-computation of switch-box settings is advantageous for real-time environments, because module connections are implemented with less run-time overhead, and additionally routing difficulties may be avoided in advance of operation. Alternatively, a server can temporarily store ("cache") switch-box settings for previous module connection requests and store them in a module log for subsequent requests. Such a module log may be further delineated according to client requester.

Method and apparatus for dynamically connecting modules in a programmable logic device has been described. Connections between pairs of modules may be partially implemented at compile-time and completed during run-time by performing configuration updates on a single column of CLBs. This allows reconfigurable data paths to be implemented without the resource, power, and delay overheads associated with bus and packet network structures, such as tri-stated buffers, while still providing a reconfiguration mechanism.

While the foregoing describes exemplary embodiment(s) in accordance with one or more aspects of the invention, other and further embodiment(s) in accordance with the one or more aspects of the invention may be devised without departing from the scope thereof, which is determined by the claim (s) that follow and equivalents thereof. Claim(s) listing steps do not imply any order of the steps. Trademarks are the property of their respective owners.

The invention claimed is:

1. A reconfigurable integrated circuit having a plurality of programmable modules, comprising:
 a first interface programmable module of the plurality of programmable modules having a first configurable block, the first configurable block having first programmable resources coupled to a first switch matrix having first input/output ports, the first interface programmable module configured to perform first interface operations;
 a first functional programmable module of the plurality of programmable modules having first configurable resources, the first functional programmable module connected to the first interface programmable module;
 a second interface programmable module of the plurality of programmable modules having a second configurable block, the second configurable block having second programmable resources coupled to a second switch matrix having second input/output ports, the second interface programmable module configured to perform second interface operations;
 a second functional programmable module of the plurality of programmable modules having second configurable resources, the second functional programmable module connected to the second interface programmable module;
 the first functional programmable module coupled to the second functional programmable module via the first switch matrix being coupled to the second switch matrix; and
 the first interface programmable module and the second interface programmable module wrapping the first functional programmable module and the second functional programmable module, respectively, to provide design connections for coupling the first functional programmable module to the second functional programmable module via the first switch matrix and the second switch matrix;
 wherein the first functional programmable module and the second functional programmable module are each subject to programmable reconfiguration of the first configurable resources and the second configurable resources, respectively, during run-time;
 wherein the first functional programmable module being wrapped by the first interface programmable module is effectively isolated from the second functional programmable module to allow programmable reconfiguration of the first functional programmable module during run-time;
 wherein the second functional programmable module being wrapped by the second interface programmable module is effectively isolated from the first functional programmable module to allow programmable reconfiguration of the second functional programmable module during run-time; and
 wherein the design connections connecting the first interface programmable module to the second interface programmable module are run-time reconfigurable connections.

2. The reconfigurable integrated circuit of claim 1 further comprising a third functional programmable module of the plurality of programmable modules, comprising third configurable logic, the third functional programmable module directly connected to the first functional programmable module such that a functional unit is formed.

3. The reconfigurable integrated circuit of claim 1 wherein the first configurable logic is selected from a group consisting of a LUT, RAM, and shift register.

4. The reconfigurable integrated circuit of claim 3 wherein the first functional programmable module further comprises a switch.

5. The reconfigurable integrated circuit of claim 1 wherein the first functional programmable module is selected from a group consisting of a CLB, a programmable IOB, and a programmable MGT.

6. A reconfigurable integrated circuit having a plurality of programmable modules, comprising:
 an interface programmable module of the plurality of programmable modules having switch matrices of configurable blocks, the interface programmable module configured to perform interface operations;
 a first functional programmable module of the plurality of programmable modules having first configurable resources, the first functional programmable module connected to the interface programmable module;
 a second functional programmable module of the plurality of programmable modules having second configurable resources, the second functional programmable module connected to the interface programmable module;

the first functional programmable module and the second functional programmable module in combination forming a functional unit; and the interface programmable module wrapping the functional unit and providing design connections for communication with the functional unit;

wherein the first functional programmable module and the second functional programmable module are each subject to programmable reconfiguration of the first configurable resources and the second configurable resources, respectively, during run-time;

wherein the functional unit being wrapped by the interface programmable module is effectively isolated from one or more other functional units or fixed logic circuits of a design to allow the programmable reconfiguration of the functional unit during run-time; and wherein the design connections include input/output ports of the switch matrices that are run-time reconfigurably connected to the one or more other functional units or the fixed logic circuits to provide run-time reconfigurable connections.

* * * * *